United States Patent
Lai et al.

(10) Patent No.: US 8,106,376 B2
(45) Date of Patent: Jan. 31, 2012

(54) METHOD FOR MANUFACTURING A RESISTOR RANDOM ACCESS MEMORY WITH A SELF-ALIGNED AIR GAP INSULATOR

(75) Inventors: Erh Kun Lai, Longjing Shiang (TW); Kuang Yeu Hsieh, Jhubei (TW); ChiaHua Ho, Kaoshing (TW)

(73) Assignee: Macronix International Co., Ltd., Hsinchu (TW)

( * ) Notice: Subject to any disclaimer, the term of this patent is extended or adjusted under 35 U.S.C. 154(b) by 36 days.

(21) Appl. No.: 11/977,088

(22) Filed: Oct. 23, 2007

(65) Prior Publication Data
US 2009/0101883 A1    Apr. 23, 2009

Related U.S. Application Data

(60) Provisional application No. 61/124,825, filed on Oct. 24, 2006.

(51) Int. Cl.
*H01L 47/00* (2006.01)
(52) U.S. Cl. ............ 257/4; 257/2; 257/536; 257/537; 257/E45.001; 257/E45.002; 257/E21.004; 438/382; 438/385
(58) Field of Classification Search ............ 257/2, 4, 257/536, 537, E45.002, E45.001, E21.004; 438/487, 382, 385; 365/148
See application file for complete search history.

(56) References Cited

U.S. PATENT DOCUMENTS

| 5,687,112 | A | 11/1997 | Ovshinsky | |
|---|---|---|---|---|
| 6,242,336 | B1 | 6/2001 | Ueda et al. | |
| 6,473,332 | B1 | 10/2002 | Ignatiev et al. | |
| 6,781,145 | B2 * | 8/2004 | Doan et al. | 257/3 |
| 6,815,704 | B1 * | 11/2004 | Chen | 257/2 |
| 7,449,710 | B2 * | 11/2008 | Lung | 257/2 |
| 2003/0003647 | A1 * | 1/2003 | Dennison et al. | 438/238 |
| 2005/0112851 | A1 | 5/2005 | Lee et al. | |
| 2005/0136594 | A1 | 6/2005 | Kim | |
| 2006/0003263 | A1 * | 1/2006 | Chang | 430/311 |
| 2006/0076641 | A1 | 4/2006 | Cho et al. | |
| 2007/0075347 | A1 * | 4/2007 | Lai et al. | 257/296 |
| 2007/0108430 | A1 * | 5/2007 | Lung | 257/4 |
| 2007/0131980 | A1 * | 6/2007 | Lung | 257/246 |
| 2007/0158633 | A1 | 7/2007 | Lai et al. | |
| 2007/0298535 | A1 * | 12/2007 | Lung | 438/102 |

FOREIGN PATENT DOCUMENTS
WO    WO 2006/079952    *   8/2006

OTHER PUBLICATIONS

U.S. Appl. No. 60/754,161, filed Dec. 27, 2005 by inventors Erh-Kun Lai, ChiaHua Ho and Kuang Yeu Hsieh, entitled "Method for Forming Self-Aligned Thermal Isolation Cell For a Phase Change Memory Array," consisting of 10 pages.
Arnal, Vincent, "Optimization of CVD dielectiric process to achieve reliable ultra low-k gaps", Jan. 2002, Microelectronic Engineering, vol. 60, Issues 1-2, pp. 143-148.
Office Action Mailed May 1, 2008 in U.S. Appl. No. 11/552,356, 23 pages.

* cited by examiner

*Primary Examiner* — Benjamin Sandvik
*Assistant Examiner* — Farid Khan
(74) *Attorney, Agent, or Firm* — Haynes Beffel & Wolfeld LLP (57) ABSTRACT

A memory device including a programmable resistive memory material is described along with methods for manufacturing the memory device. A memory device disclosed herein includes top and bottom electrodes and a multilayer stack disposed between the top and bottom electrodes. The multilayer stack includes a memory element comprising programmable resistive memory material and has a sidewall surface. An air gap is adjacent to the sidewall surface and self-aligned to the memory element.

21 Claims, 12 Drawing Sheets

METHOD FOR MANUFACTURING A RESISTOR RANDOM ACCESS MEMORY WITH A SELF-ALIGNED AIR GAP INSULATOR

REFERENCE TO RELATED APPLICATION

This application claims the benefit of U.S. Provisional Patent Application No. 61/124,825 filed 24 Oct. 2006, entitled METHOD FOR MANUFACTURING A RESISTOR RANDOM ACCESS MEMORY WITH A SELF-ALIGNED AIR GAP, by inventors Erh-Kun Lai, Chiahua Ho, and Kuang-yeu Hsieh.

BACKGROUND OF THE INVENTION

1. Field of the Invention

The present invention relates generally to electrically programmable and erasable memory, and more particularly, to memory having a small programmable resistive memory material with a self-aligned air gap.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause the transition of phase change material from the crystalline state to the amorphous state. The memory cells using phase change material include an "active region" in the bulk of the phase change material of the cell in which the actual phase transitions are located. Techniques are applied to make the active region small, so that the amount of current needed to induce the phase change is reduced. Also, techniques are used to thermally isolate the active region in the phase change cell so that resistive heating needed to induce the phase change is confined to the active region.

The magnitude of the reset current needed for reset can be reduced by reducing the size of the phase change material element in the cell and/or the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Another technology developed by the assignee of the present application is referred to as a phase change bridge cell, in which a very small patch of memory material is formed as a bridge across a thin film insulating member located between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., incorporated by reference as if fully set forth herein, which application was owned at the time of invention and is currently owned by the same assignee.

Yet another approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell using gaps or voids on the sides of the phase change material. It has also been proposed to use thermally insulating materials to improve the confinement of heat to the active region.

Also, approaches to improving thermal isolation include forming the phase change element in a way that tends to isolate the active region from the electrodes, as shown for example in U.S. patent application Ser. No. 11/348,848, filed 7 Feb. 2006, entitled "I-Shaped Phase Change Memory Cell" by Chen et al., incorporated by reference as if fully set forth herein, which application was owned at the time of invention and is currently owned by the same assignee.

Problems have arisen in manufacturing devices with very small dimensions, and with variations in process that meet tight specifications needed for large-scale memory devices. It is therefore desirable to provide a memory cell structure having small dimensions and low reset currents, as well as a structure that addresses the heat flow problem, and methods for manufacturing such structure that meets tight process variation specifications needed for large-scale memory devices.

SUMMARY OF THE INVENTION

A memory device including a programmable resistive memory material is described along with methods for manufacturing the memory device.

A memory device disclosed herein includes top and bottom electrodes and a multilayer stack disposed between the top and bottom electrodes. The multilayer stack includes a memory element comprising programmable resistive memory material. An air gap is adjacent to a sidewall surface of the memory element and is self-aligned to the memory element.

A method for manufacturing disclosed herein includes patterning a structure to form a stack having a sidewall, the stack including a memory layer comprising programmable resistive material. A self-aligned hard mask is formed on the stack and a fill on the sidewall of the stack. The stack is etched using the hard mask as an etch mask, thereby forming a memory element from the memory layer and defining a void between the fill and the memory element. A first dielectric material is deposited in a portion of the void, thereby forming an air gap self-aligned to the memory element.

The present invention advantageously provides a self-aligned process in the manufacturing of memory cells.

In embodiments of memory cells described herein including phase change material memory elements, the active region of the memory element can be made extremely small, thereby reducing the amount of current needed for reset. The extremely small active region is a result of the memory element having a width preferably less than a minimum feature size for a lithographic process used to form the memory cells, and by the air gap self-aligned to the memory element and providing thermal isolation to reduce heat dissipation away from the active region. The thickness of the memory element can be established using thin film deposition techniques and thus can be made very thin.

The structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

A description of structural embodiments and methods of the present invention is provided with reference to FIGS. 1-12. It is to be understood that there is no intention to limit the invention to the specifically disclosed embodiments but that the invention may be practiced using other features, elements, methods and embodiments. Like elements in various embodiments are commonly referred to with like reference numerals.

Figure 1:
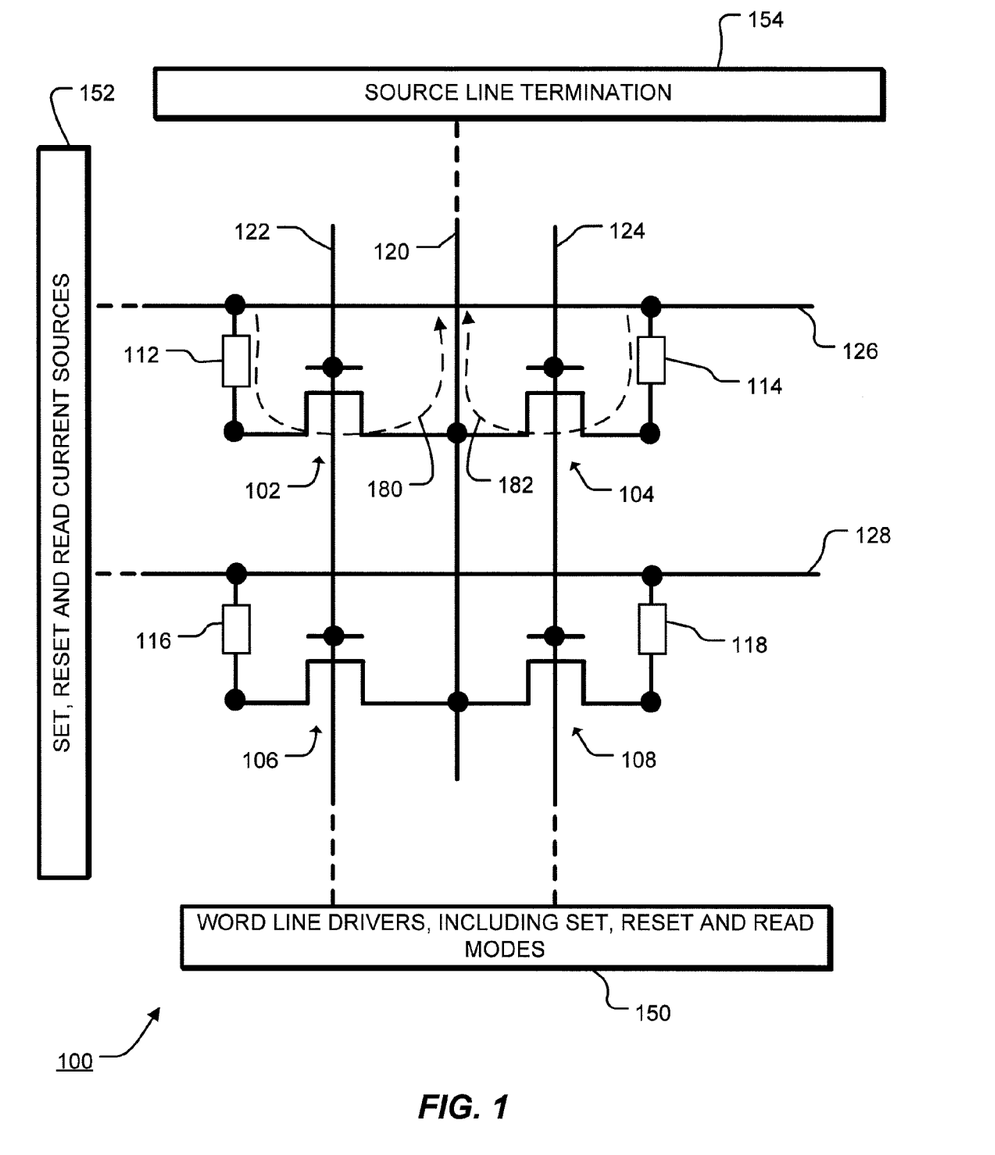
FIG. 1 is a schematic illustration of a memory array which can be implemented using memory cells having self-aligned air gaps as described herein.

FIG. 1 is a schematic illustration of a memory array 100, which can be implemented using memory cells having self aligned air gaps as described herein. Four memory cells 102, 104, 106, and 108 having respective memory elements 112, 114, 116, and 118 each having respective self aligned air gaps (not shown) are illustrated in FIG. 1, representing a small section of an array that can include millions of memory cells.

In the schematic illustration of FIG. 1, common source line 120 and word lines 122, 124 are arranged generally parallel in the y-direction. Bit lines 126, 128 are arranged generally parallel in the x-direction. Thus, a y-decoder and a word line driver 150, having set, reset, and read modes, are coupled to the word lines 122, 124. Bit line current sources 152 for set, reset, and read modes, a decoder and sense amplifiers (not shown) are coupled to the bit lines 126, 128. The common source line 120 is coupled to the source line termination circuit 154, such as a ground terminal. The source line termination circuit 154 may include bias circuits such as voltage sources and current sources, and decoding circuits for applying bias arrangements, other than ground, to the source lines in some embodiments.

The common source line 120 is coupled to the source terminals of memory cells 102, 104, 106, and 108. The word line 122 is coupled to the gate terminals of memory cells 102, 106. The word line 124 is coupled to the gate terminals of memory cells 104, 108.

Memory cells 102, 104 including respective memory elements 112, 114 are representative. The memory element 112 couples the drain of memory cell 102 to bit line 126. Likewise, memory element 114 couples the drain of memory cell 104 to bit line 126. In operation, current sources 152 operate in a lower current read mode, one or more intermediate current set modes, and a higher current reset mode. During the higher current reset mode, a current path 180 through the selected memory cell (e.g. memory cell 102 including memory element 112) is established by applying a voltage and current to the bit line 126, and voltages on the word line 122 and source line 120 sufficient to turn on the access transistor to memory cell 102, so that the current flows through the source line 120.

Likewise, during the lower current read mode, a current path 182 through the selected memory cell (see the memory cell 104 including memory element 114) is established by applying a voltage and current to the bit line 126, and voltages on the word line 124 and source line 120 sufficient to turn on the access transistor of memory cell 104 and provide for current flow to the source line 120.

During set mode, used for one or more intermediate current levels, an access transistor is enabled, as just described with respect to the read mode.

Figure 2:
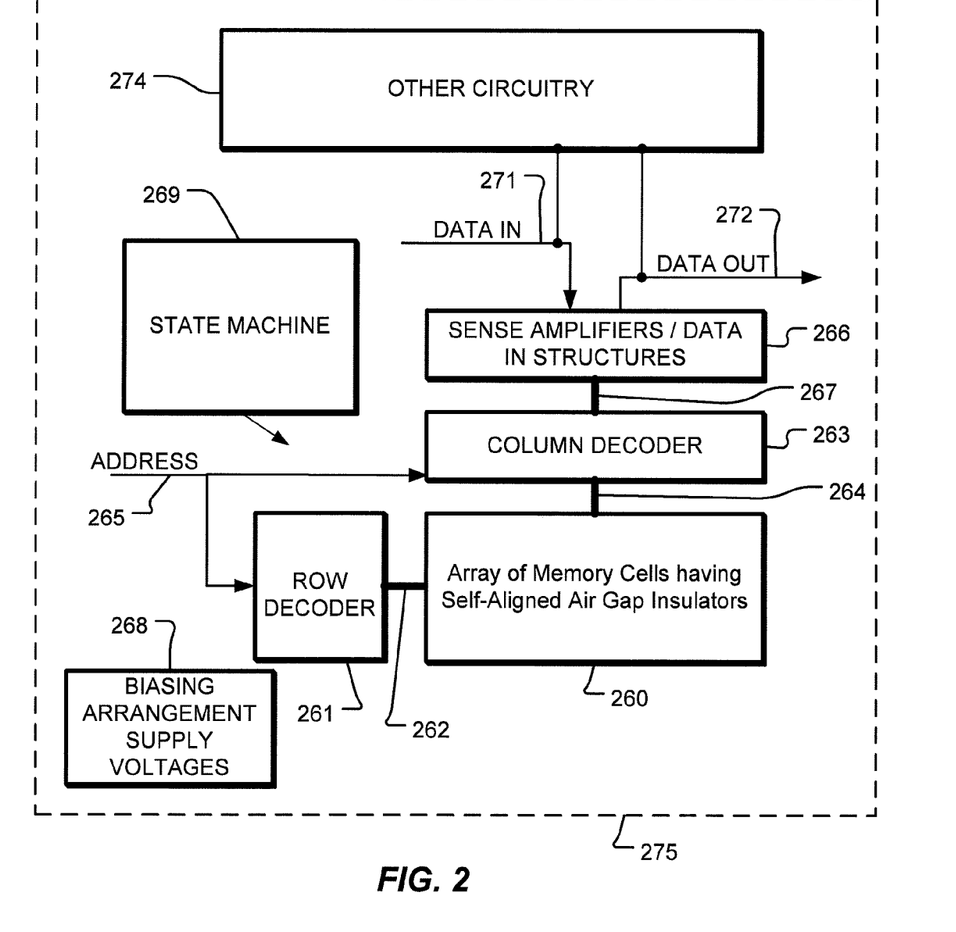
FIG. 2 is a simplified block diagram of an integrated circuit in accordance with an embodiment.

FIG. 2 is a simplified block diagram of an integrated circuit 200 in accordance with an embodiment. The integrated circuit 275 includes a memory array 260 implemented using resistance random access memory cells having self-aligned air gap insulators. A row decoder 261 having read, set, and reset modes is coupled to a plurality of word lines 262 arranged along rows in the memory array 260. A column decoder 263 is coupled to a plurality of bit lines 264 arranged along columns in the memory array 260 for reading, setting, and resetting memory cells in the memory array 260. Addresses are supplied on a bus 265 to column decoder 263 and row decoder 261. Sense amplifiers and data-in structures in a block 266, including current sources for the read, set, and reset modes are coupled to the column decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry 274 is included on the integrated circuit 275, such as a general purpose processor or special purpose application circuitry, or a combination of modules providing system-on-a-chip functionality supported by the resistance random access memory cell array. Data is supplied via the data-out line 272 from the sense amplifiers in block 266 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages for the word lines and bit lines, and controls the word line/source line operation using an access control process. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
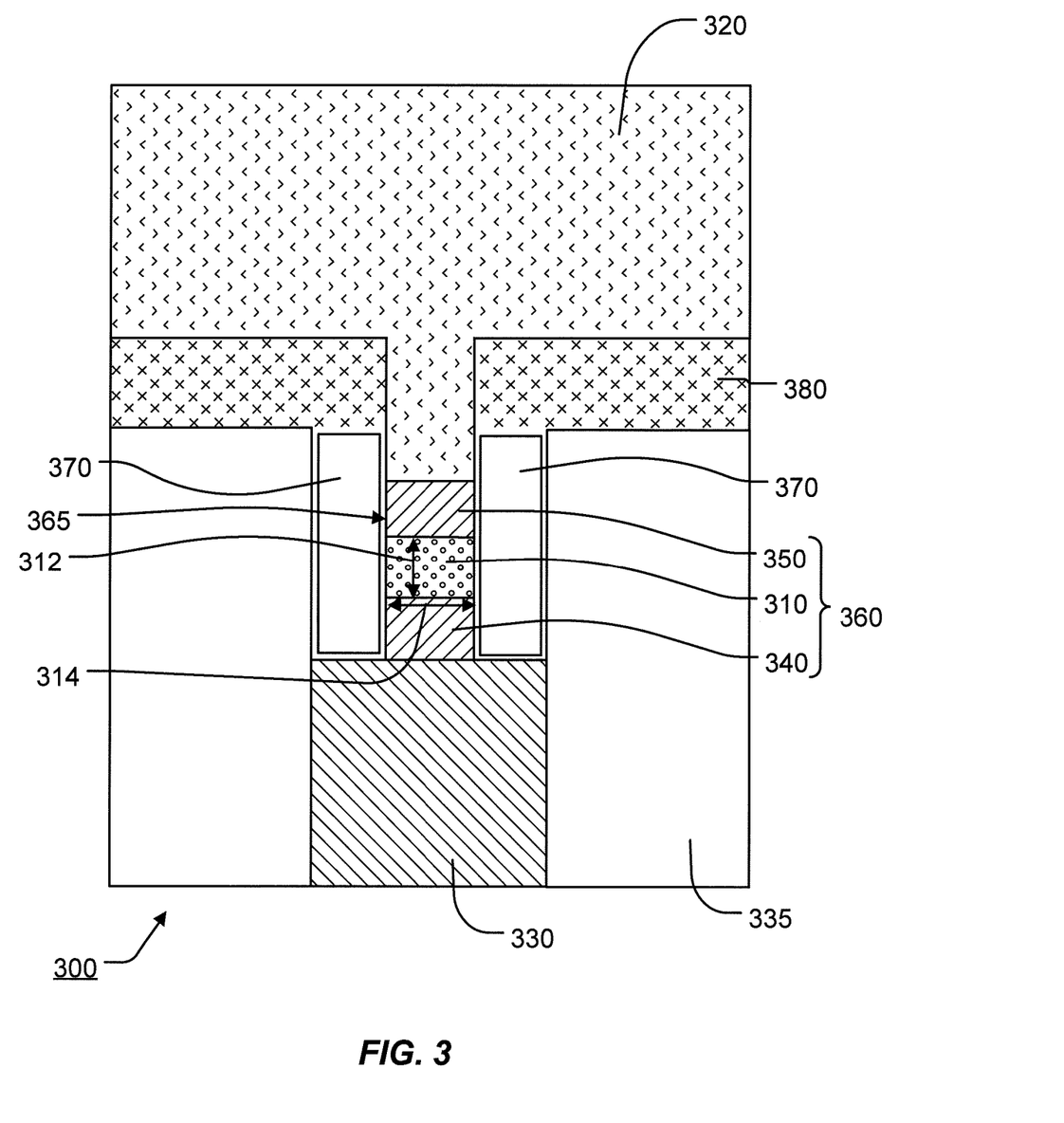
FIG. 3 illustrates a cross-sectional view of memory cell in accordance with an embodiment.

FIG. 3 illustrates a cross-sectional view of a memory cell 300 in accordance with an embodiment, the memory cell 300 including a programmable resistive memory element 310 having a sidewall surface 365 adjacent to a self-aligned air gap 370.

In the illustrated embodiment of FIG. 3 a multilayer stack 360 is disposed between a bottom electrode 330 and a top electrode 320 (which is a portion of a bit line in some embodiments), the multilayer stack 360 comprising a bottom heater 340 on the bottom electrode 330, the memory element 310 on the bottom heater 340, and a top heater 370 on the memory element 310.

The top and bottom heaters 330, 340 may each comprise, for example, TiN, TaN, TiAlN, TaAlN, TiW, TiSiN, or TaSiN. TiN may be preferred in embodiments in which the memory element 310 comprises GST (discussed below) because it makes good contact with GST, it is a common material used in semiconductor manufacturing, and it provides a good diffusion barrier at the higher temperatures at which GST transitions, typically in the 600-700° C. range. In some alternative embodiments one or both of the top and bottom heaters 340, 350 may be omitted.

The bottom electrode 330 extends from the stack 360 through an inter-layer dielectric 335 to couple to underlying access circuitry (not shown). The bottom electrode 330 may comprise, for example, TiN, TaN, TiAlN, or TaAlN, or comprises as further examples one or more elements selected from the group consisting of Ti, W, Mo, Al, Ta, Cu, Pt, Ir, La, Ni, and Ru and alloys thereof.

In operation, voltages on the top electrode 320 and the bottom electrode 330 can induce current to flow from the top electrode 320 to the bottom electrode 330, or vice versa, via the stack 360.

In embodiments of the memory cell 300 including phase change based materials (described below) for memory element 310, the current in the bottom heater 340, the top heater 350, and the memory element 310 can generate heat sufficient to induce an active region of the memory element 310 to undergo a phase change between at least two solid phases. As can be appreciated the active region can be made extremely small in the illustrated structure, thus reducing the magnitude of current needed to induce a phase change. The thickness 312 of the memory element 310 can be established using a thin film deposition technique of memory material. Furthermore, the memory element 310 has a width or diameter 314 which is preferably less than a minimum feature size for a process, typically a lithographic process, used to form the memory cell 300. In one embodiment the width 310 is between about 50 nm and 80 nm. The small memory element 310 results in a concentrated current density, thereby reducing the magnitude of the current needed to induce a phase change in the active region.

The air gap 370 and the stack 360 are formed such that the air gap 370 is self-aligned and adjacent to the sidewall surface 365 of the stack 360. This can be done in some embodiments, for example, by selectively etching the stack 360 and using the bottom electrode 330 as an etch stop layer.

It will be understood that the term adjacent as used herein is not limited to objects that are in direct contact. For example, in the illustrated embodiment of FIG. 3 a thin layer of dielectric 380 contacts the sidewall surface 365 and separates the air gap 370 from the stack 360. The dielectric 380 protects the air gap 370 in subsequent steps used in the manufacturing of the memory cell 300, and in embodiments in which the layer 380 encapsulates the air gap 370 it may also provide some mechanical stability.

The air gap 370 provides thermal isolation to reduce heat dissipation away from the memory element 310 and the top and bottom heaters 350, 340 into the dielectric 335, which helps to reduce the amount of current necessary to induce a phase change in the memory element 310. In the illustrated structure the air gap 370 has an annular shape, although the invention is not limited to such and the air gap 370 can have other shapes as will be appreciated by those skilled in the art. In preferred embodiments the air gap 370 completely surrounds the memory element 310. Although a single air gap 370 is illustrated, in some alternative embodiments the air gap 370 may comprise two or more self-aligned air gaps each adjacent to the memory element 310.

Embodiments of the memory cell 300 include phase change based memory materials, including chalcogenide based materials and other materials, for the memory element 310. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon oxygen, silicon dioxide, silicon nitride, copper, silver, gold, aluminum, aluminum oxide, tantalum, tantalum oxide, tantalum oxide, tantalum nitride, titanium and titanium oxide. See, for example U.S. Pat. No. 6,800,504, and U.S. Patent Application Publication No. US 2005/0029502.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE v.* 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or a magnetron-sputtering method with source gas(es) of Ar, $N_2$, and/or He, etc. at the pressure of 1 mTorr ~100 mTorr. The deposition is usually performed at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallized state of chalcogenide material. The annealing temperature typically ranges from 100° C. to 400° C. with an annealing time of less than 30 minutes.

The thickness of chalcogenide material depends on the design of a cell structure.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or a magnetron-sputtering method with source gases of Ar, $N_2$, $O_2$, and/or He, etc. at the pressure of 1 mTorr ~100 mTorr. The deposition temperature can range from room temperature to ~600° C., depending on the post deposition treatment condition. A collimator with an aspect ratio of 1~5 can be used to improve the fill-in performance. To improve the fill-in performance, the DC bias of several tens of volts to several hundreds of volts is also used. On the other hand, the combination of DC bias and the collimator can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$;

$Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimator with an aspect ratio of 1~5 can be used to improve the fill-in performance. To improve the fill-in performance, a DC bias of several tens of volts to several hundreds of volts is also used. If desired, a combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimator with an aspect ratio of 1~5 can be used to improve the fill-in performance. To improve the fill-in performance, a DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range from several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat, or a Ta-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an annealing time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

FIGS. 4-10 illustrate steps in a fabrication sequence in accordance with an embodiment for manufacturing memory cells as described herein. The following description does not repeat certain explanations regarding materials, thicknesses, and the like, as set out above.

Figure 4:
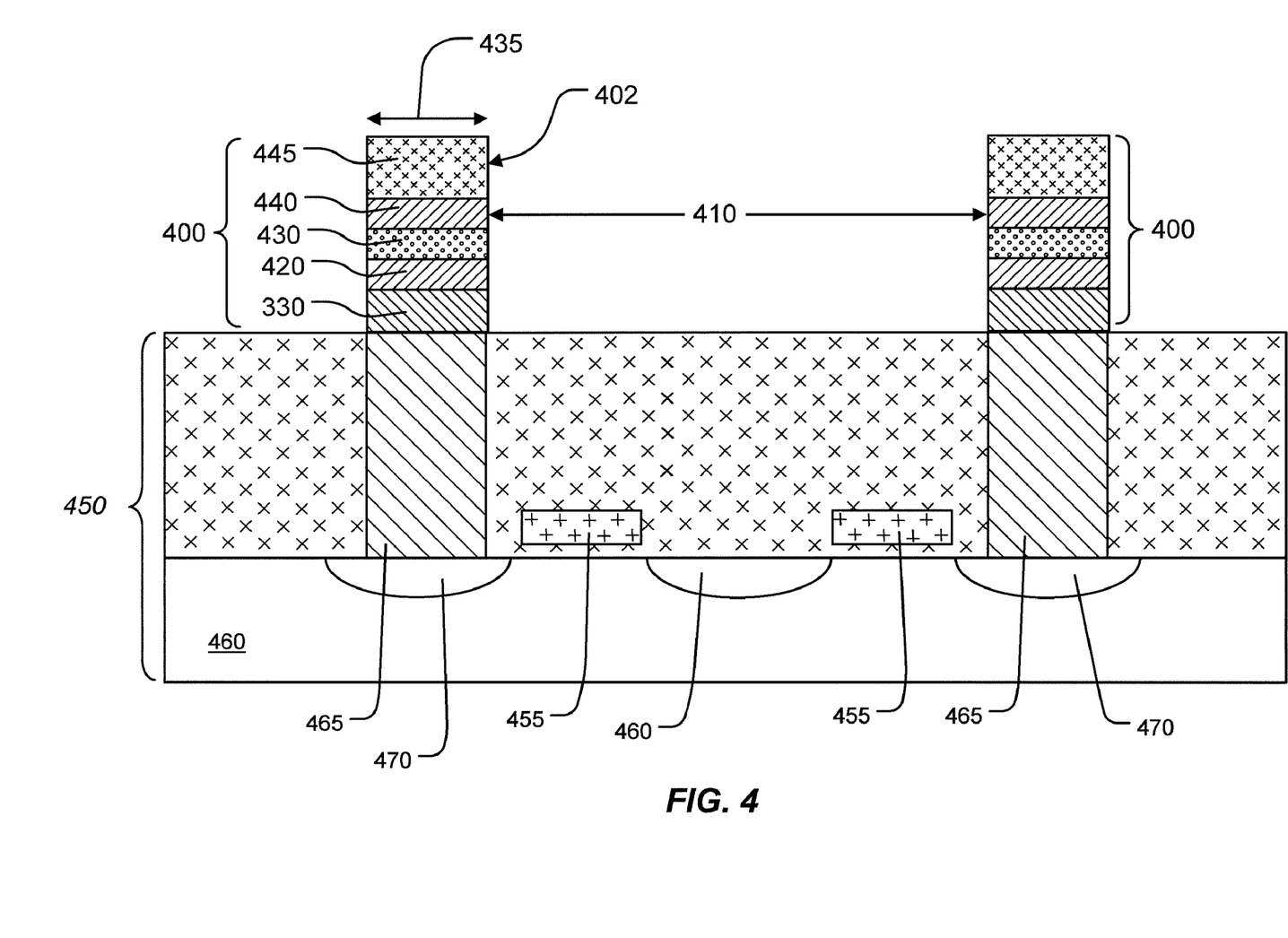
FIGS. 4-10 illustrate steps in a fabrication sequence in accordance with an embodiment for manufacturing memory cells as described herein.

FIG. 4 illustrates a cross-sectional view of a structure formed as a first stage of the fabrication sequence, the structure overlying a memory access layer 450 and including stacks 400 having sidewalls 402 and openings 410 between the stacks 400. The memory access layer 450 can be formed by standard processes as known in the art, and in the illustrated embodiment includes word lines 455 extending in parallel in a direction into and out of the cross-section illustrated in FIG. 4. The word lines 455 overly a substrate 460 and form the gates of access transistors. Access layer 450 also includes a common source doped region 460 acting as the source regions of the access transistors. Conductive plugs 465 couple respective stacks 400 to corresponding doped regions 470 acting as the drain regions for the access transistors. It will be understood that the present invention is not limited to the illustrated embodiment of access layer 450, and other configurations for access layer 450, including using diodes for access devices, will be apparent to those skilled in the art.

In the illustrated embodiment the stacks 400 each comprise a bottom electrode 330, a first heater layer 420, a memory layer 430, a second heater layer 440, and a cap layer 445. Alternatively, the bottom electrode 330 and/or one or both of the first and second heater layers 420, 440 may be omitted in some embodiments.

The stacks 400 can be formed on the access layer 450, for example, by sequentially forming the layers of the stack 400 on the access layer 450, then patterning photoresist on the layers and overlying the regions where the stacks 400 will be formed, and then etching the layers using the patterned photoresist as a mask.

The stacks 400 have a width or diameter 435 preferably equal to a minimum feature size for a lithographic process used to form the stacks 400. For example, the diameter 435 may be between about 50 nm to about 200 nm.

In some embodiments the thickness of the first and second heater layers 420, 440 each range from about 100 Å to about 100 Å. The memory layer 430 has a thickness that ranges from about 200 Å to 1000 Å in one embodiment. The bottom electrode 330 can be implemented with a conductive material such as aluminum (Al), titanium nitride (TiN) or metal. The cap layer 445 has an exemplary thickness that ranges from about 300 Å to about 1000 Å, and can be implemented with a material such as silicon nitride.

Figure 5A:
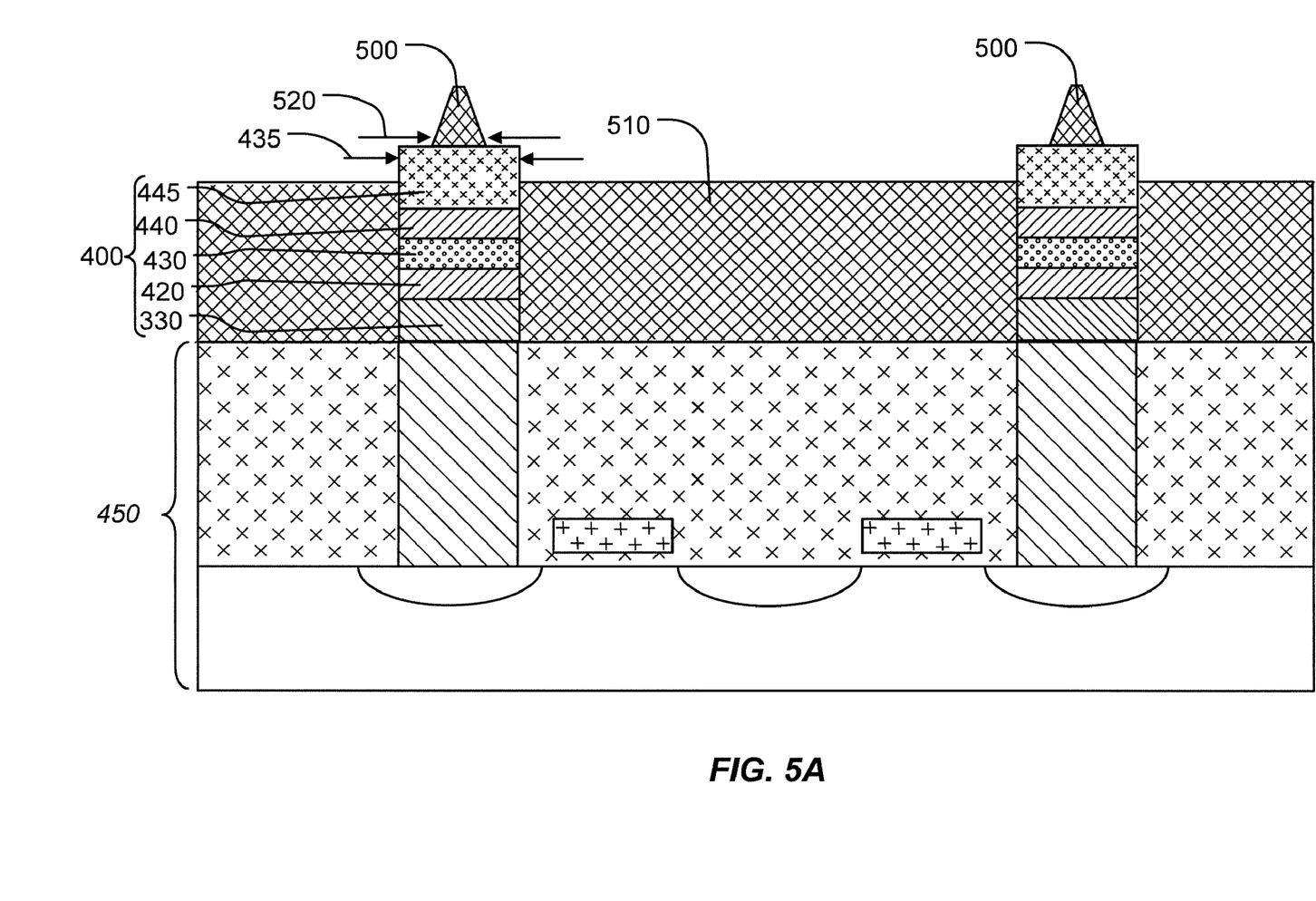

Next, self-aligned hard masks 500 are formed on the stacks 400 and fill 510 in the openings 410 of the structure illustrated in FIG. 4, resulting in the structure illustrated in FIG. 5A. The hard masks 500 and fill 510 can be formed using a high density plasma (HDP) deposition followed by a wet dip process.

Figure 5B:
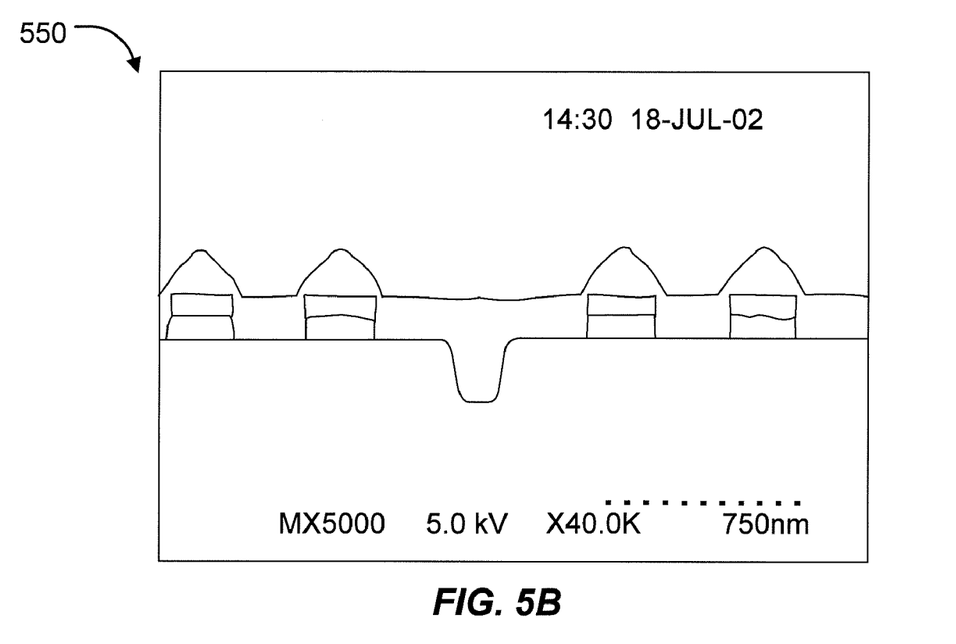
Figure 5C:
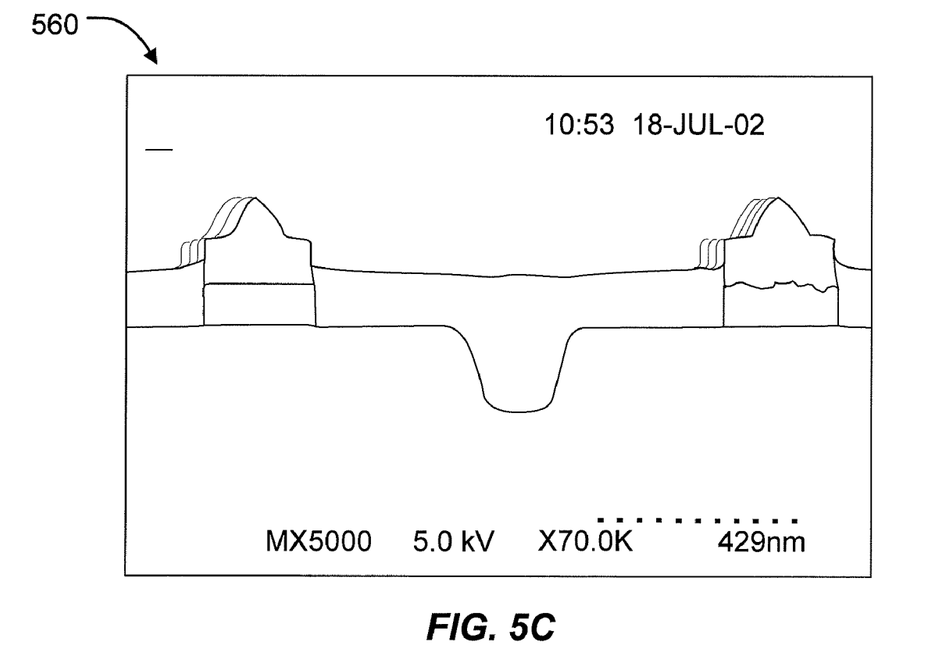

Two experimental images 550, 560 that illustrate a HDP deposition and a post high density plasma dip are shown in FIGS. 5B and 5C respectively. The HDP process deposits a dielectric material overlying and aligned to the stacks 400, and a wet dip process such as a high density plasma dip is used to expose a portion of the cap layer 445 and thus form the hard masks 500 self-aligned to the stacks 400.

The hard masks 500 have a width 520 less than the width 435 of the stack 400, and thus the width 520 can be less than the minimum feature for the process, typically a lithographic process, used to form the stack 400. In some embodiments the width 520 is between about 20 nm and about 100 nm, in one example being approximately 63 nm.

In the illustrated embodiment of FIG. 5A the hard masks 500 have a conical shape having an essentially flat top surface. The shape of the hard masks 500 depends upon the HDP process and/or the wet dip process, and thus the hard masks 500 may have other shapes as can be appreciated by those skilled in the art.

The hard mask 500 comprises a material that allows the cap layer 435 to be selectively etched using the hard mask 500 as an etch mask. For example, the hard mask 500 may comprise one of silicon nitride or an oxide, while the cap layer 445 comprises the other.

Figure 6:
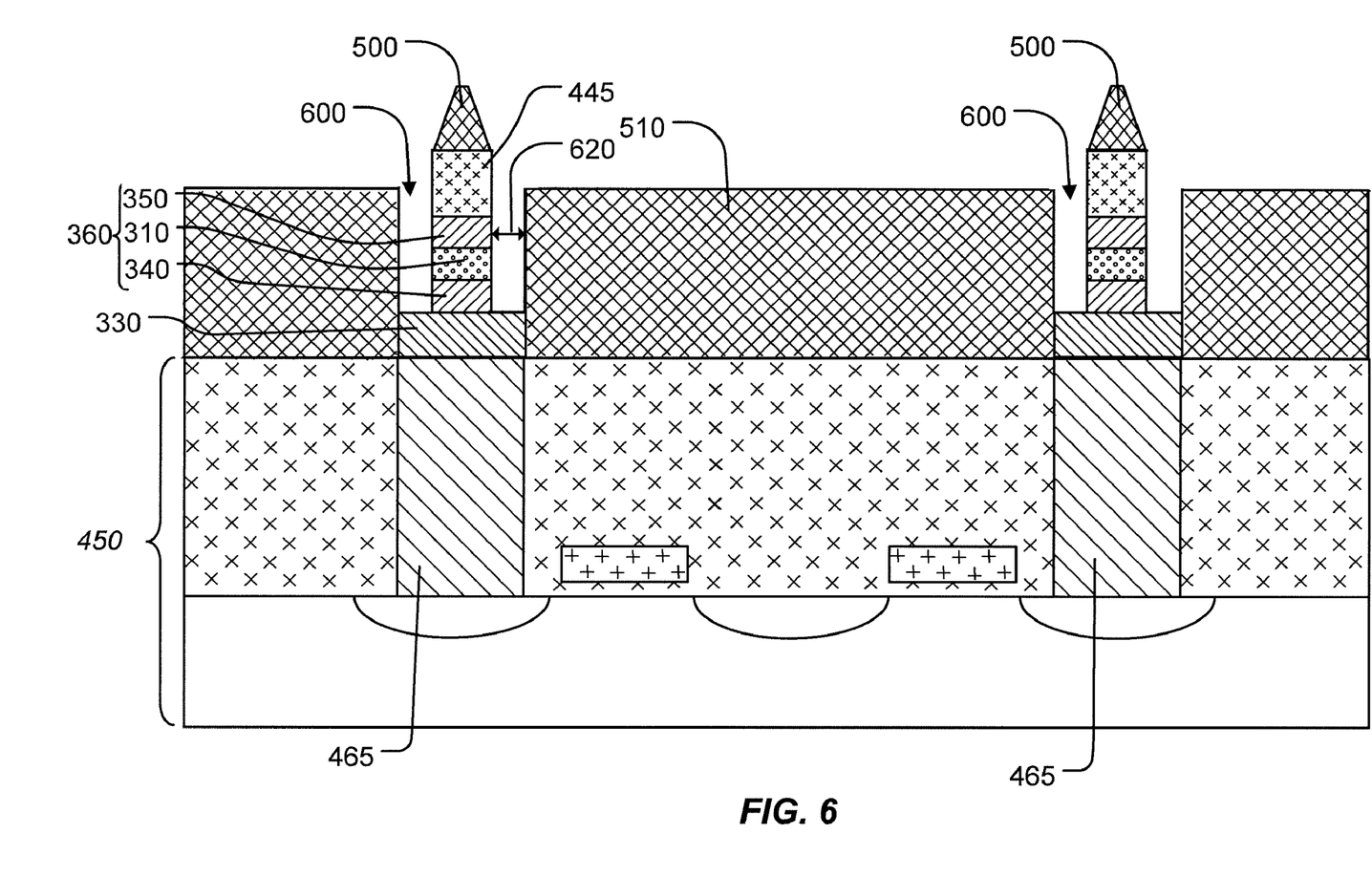

Next, the structure illustrated in FIG. 5A is etched using the hard masks 500 as an etch mask, resulting in the structure illustrated in FIG. 6 having multi-layer stacks 360 and self-aligned voids 600 between the stacks 360 and the fill 510. In the illustrated embodiment the voids 600 extend down to the bottom electrode 330. Alternatively, the voids 600 may extend into the bottom electrode 330. In some embodiments in which the bottom electrode 330 is omitted, the plugs 465 may act as bottom electrodes and the voids 600 may extend down to or into the plugs 465.

In preferred embodiments voids 600 completely surrounds the memory elements 310. Alternatively, two or more voids may be formed adjacent to the programmable memory element 310. In one embodiment the void 600 has a width 620 between about 20 nm and about 50 nm.

The etching process to form the voids 600 may be a single etch through the cap layer 445, the second heater layer 440, the memory material 430, and the first heater layer 420, or it may be a multiple step etch process. For example, first etching could be done to the cap layer 445 with a first etch chemistry using the hard mask as an etch mask, and a second etching done with a second etch chemistry using the cap layer 445 and the hard mask 500 as an etch mask.

Figure 7:
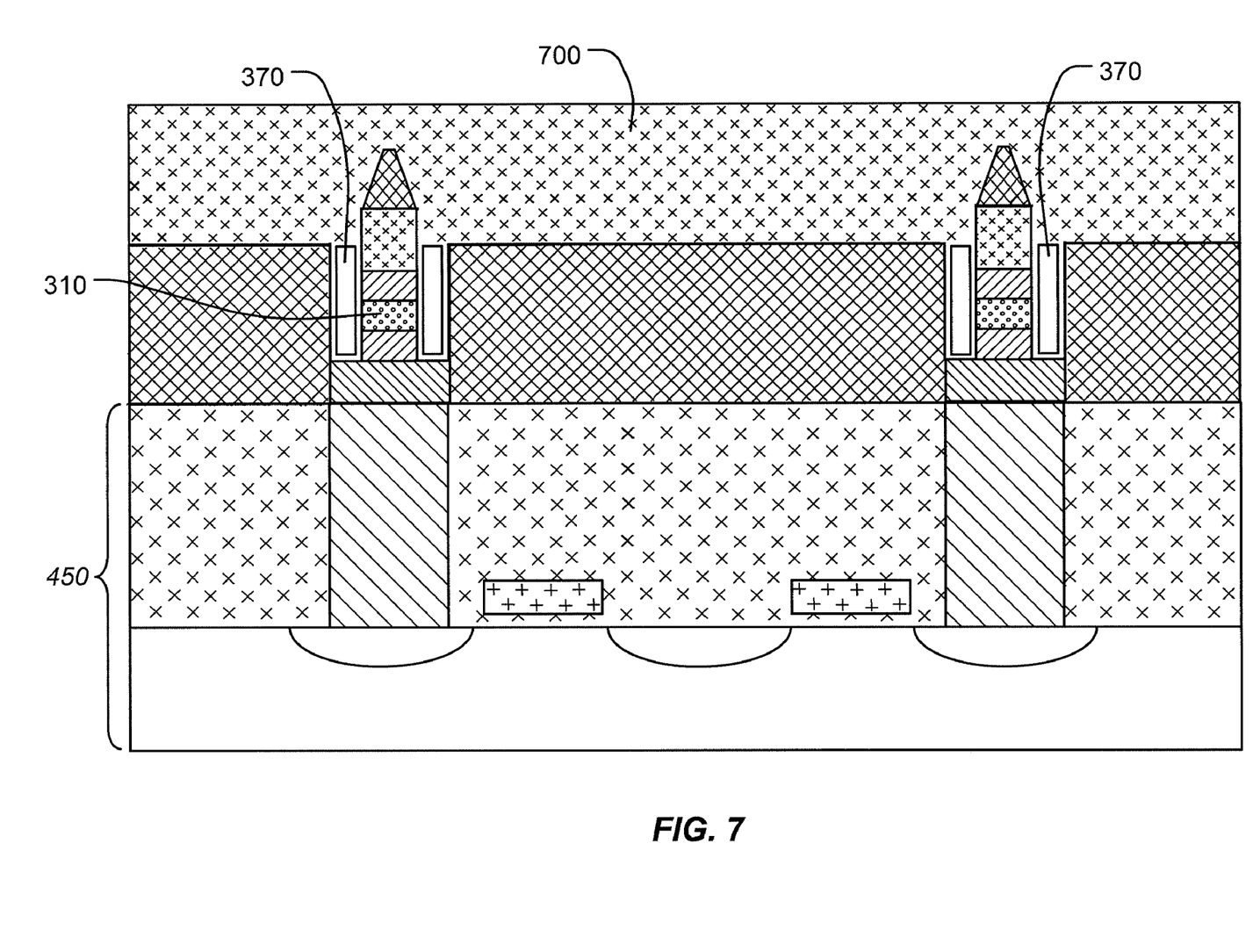

Next, a dielectric 700 is formed using a low conformal and low step coverage process on the structure illustrated in FIG. 6, resulting in the structure illustrated in FIG. 7 having air gaps 370 within the voids 600 and self-aligned to the memory elements 310. In the illustrated embodiment the dielectric 700 is deposited into a portion of the voids to form the air gaps 370. A suitable deposition of the dielectric 700 is implemented using an atmospheric pressure chemical vapor deposition (APCVD).

Figure 8:
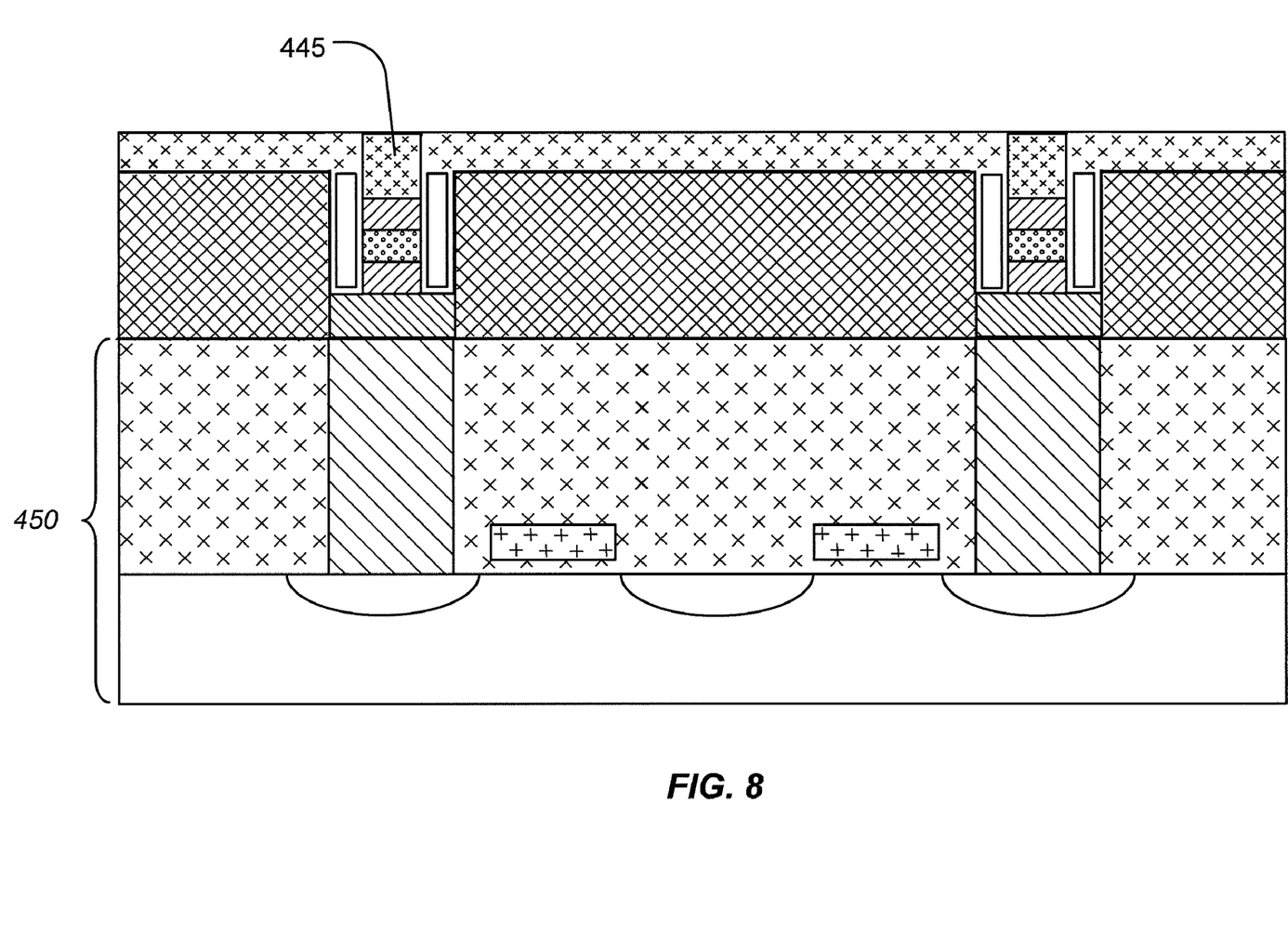

Next, the structure illustrated in FIG. 7 is planarized, for example using chemical mechanical polishing CMP, to remove the hard masks 500 and expose the cap layer 445, resulting in the structure illustrated in FIG. 8. Embodiments of the process include an optional brush clean and liquid and or gas clean procedures, as known in the art.

Figure 9:
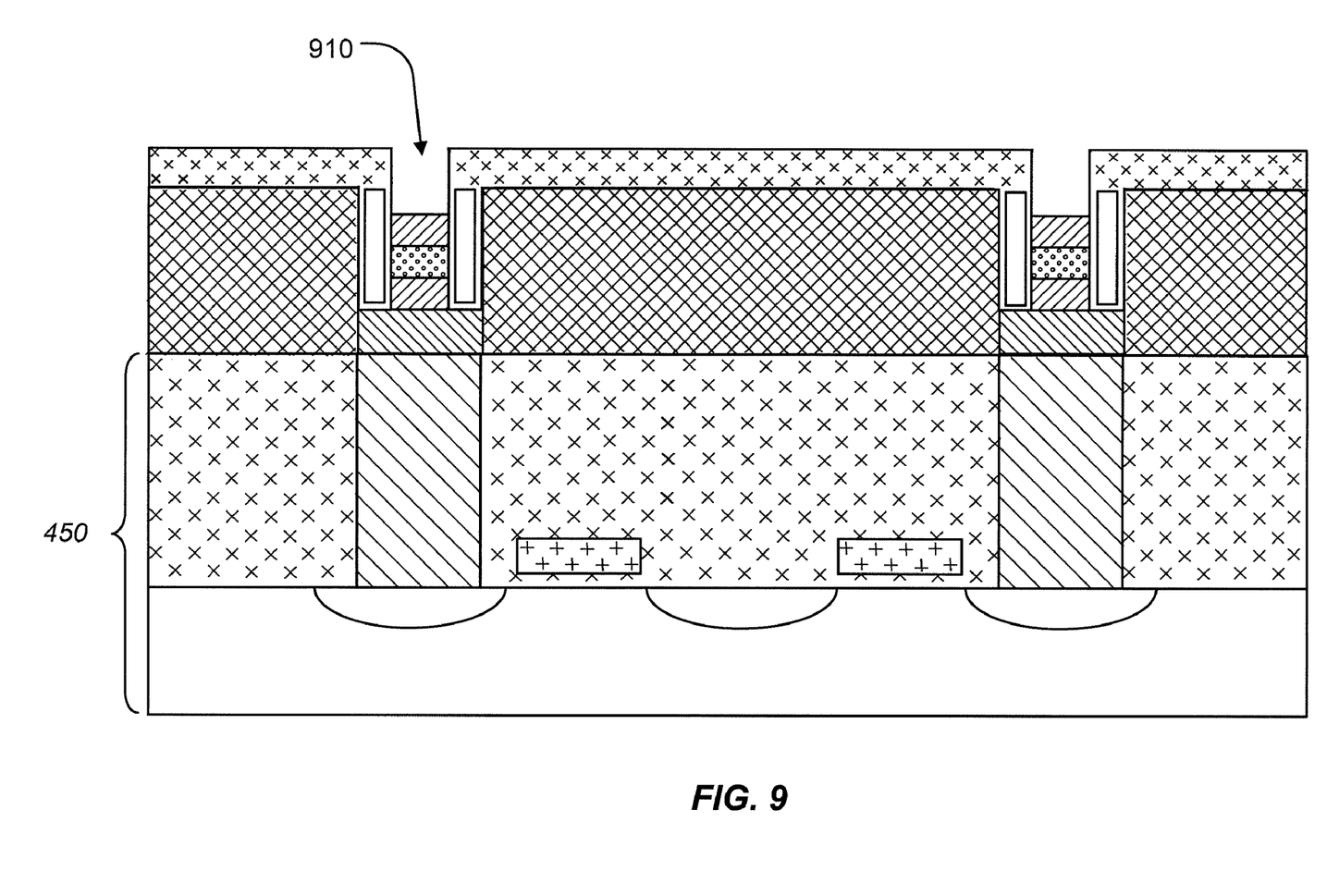
Figure 10:
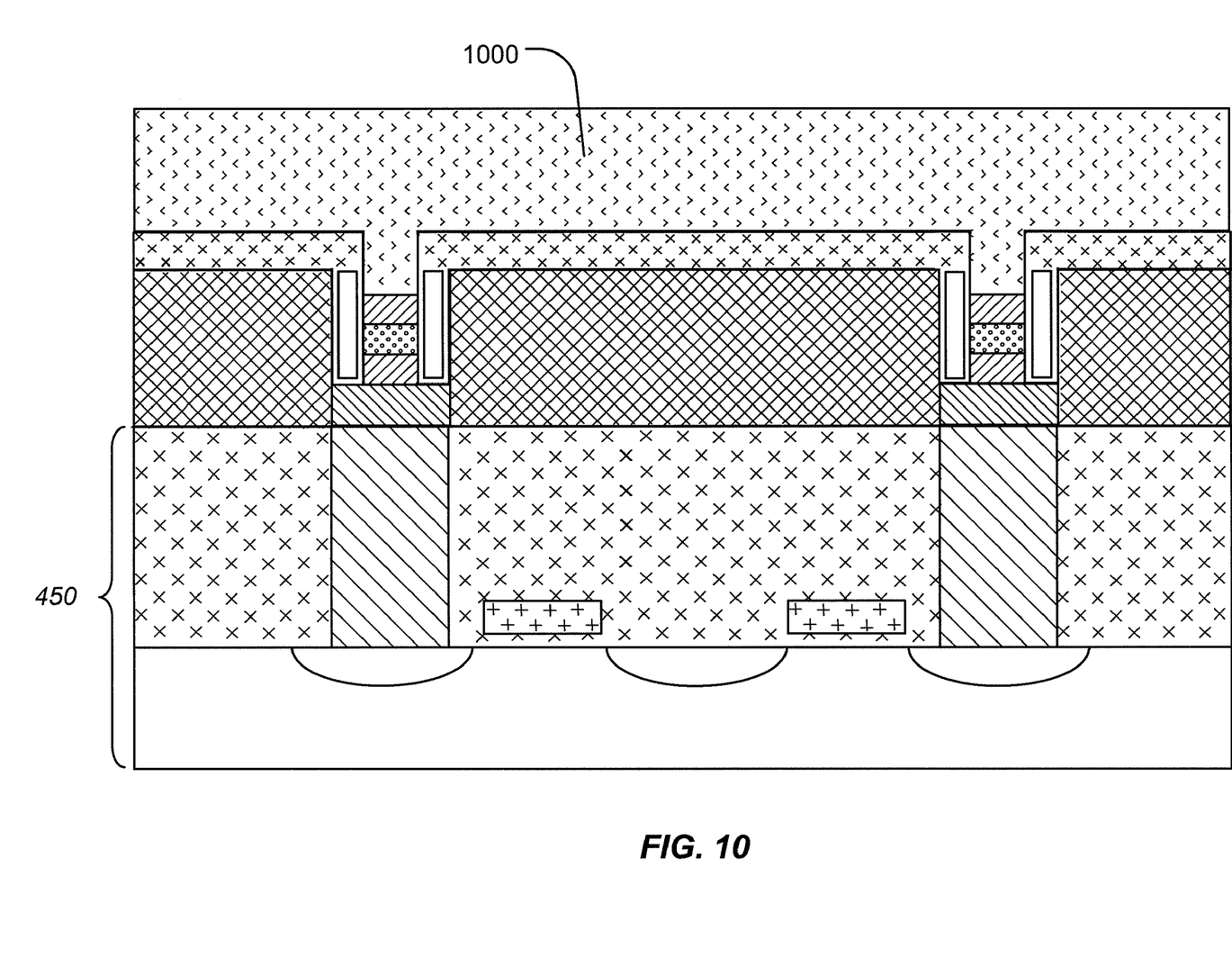

Next, the cap layer 445 is removed from the structure illustrated in FIG. 8, resulting in the structure illustrated in FIG. 9 having cavities 910. A bit line 1000 acting as a top electrode and comprising conductive material such as metal is then deposited and patterned on the structure illustrated in FIG. 9, resulting in the structure illustrated in FIG. 10.

Figure 11:
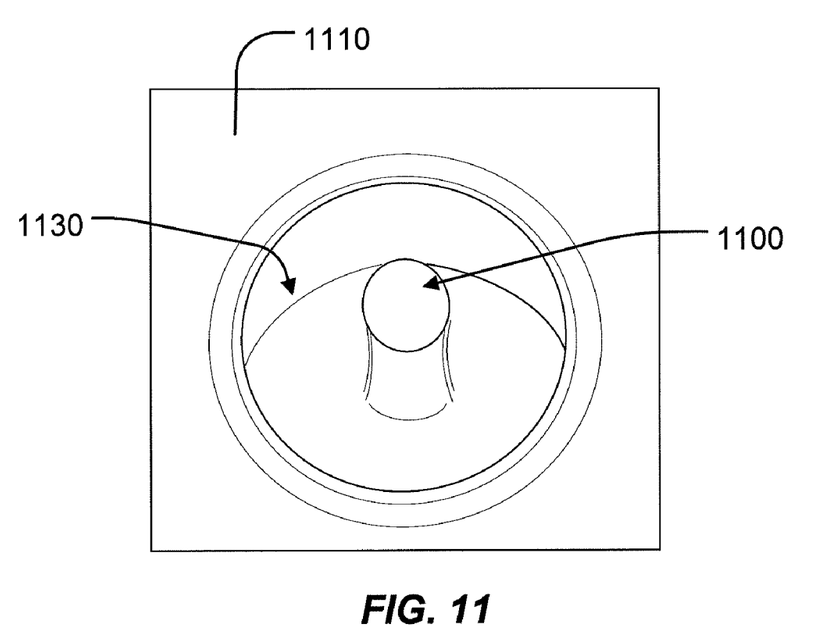
FIGS. 11 and 12 respectively illustrate an experimental image and a simplified cross-sectional view of a self-aligned hard mask and fill on a plug and etched to form a self-aligned void.
Figure 12:
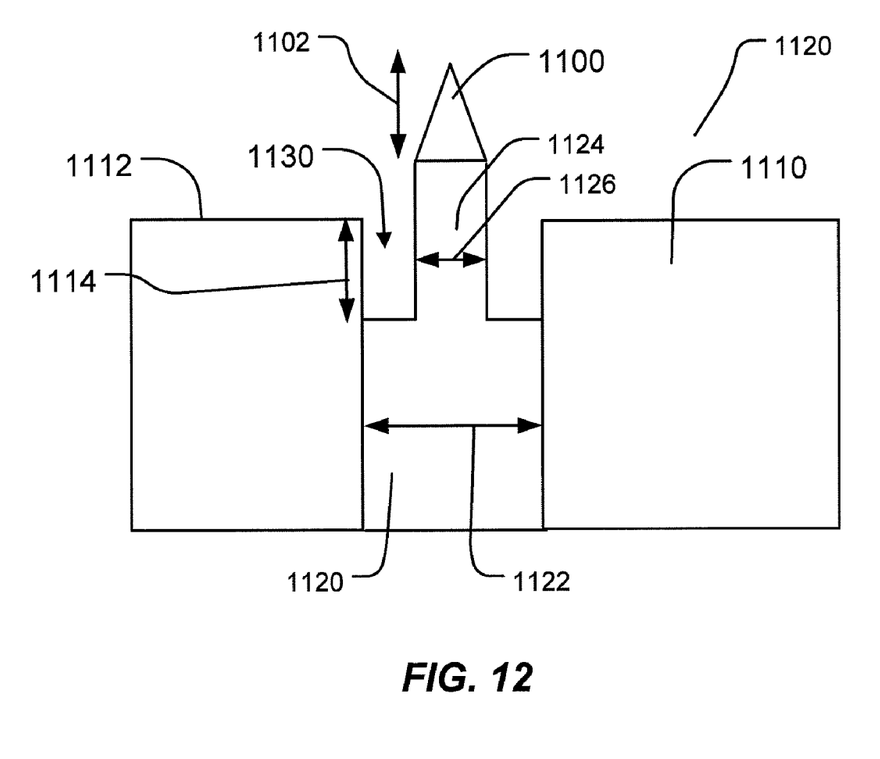

FIGS. 11 and 12 respectively illustrate an experimental image and a simplified cross-sectional view of a self-aligned cap 1100 and fill 1110 formed on a plug 1120 and etched to form a self-aligned void 1130, FIGS. 11 and 12 further illustrating examples of dimensions for memory cells described herein. The plug 1120 may comprise one or more layers of materials such as memory materials, heater materials, and electrode materials as described herein. In the illustrated embodiment, the plug 1120 has a bottom portion having a width or diameter 1122 between about 0.2 μm and 0.3 μm, and a pillar portion 1124 surrounded by void 1130 and having a width or diameter 1126 of between about 50 nm and 80 nm, for example being about 63 nm. The cap 1100 has a height 1102 of approximately 150 nm, and the void 1130 extends below the top surface 1112 of the fill 1110 a distance 1114 of between about 100 nm and about 300 nm.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

What is claimed is:

1. A memory device comprising:
   a bottom electrode;
   a top electrode;
   a multi-layer stack comprising a plurality of layers, the multi-layer stack contacting the top and bottom electrodes to define an inter-electrode current path through each of said layers between the top and bottom electrodes, the multi-layer stack including a first heater layer and a second heater layer and a memory element comprising a programmable resistive memory material, the memory element being sandwiched by the first heater layer and the second heater layer, the multi-layer stack having a sidewall surface defining a width of the first heater layer and of the second heater layer and of the memory element transverse to the inter-electrode current path which is less than a width of a top surface of the bottom electrode in contact with the multi-layer stack; and
   an air gap adjacent to the sidewall surface of the memory element, the first heater layer, and the second heater layer and self-aligned to the memory element.

2. The device of claim 1, wherein the memory element has a width less than a minimum feature size for a lithographic process used to form the memory device.

3. The device of claim 1, wherein the air gap completely surrounds the memory element.

4. The device of claim 1, wherein:
   the first heater layer is on the bottom electrode, the memory element is on the first heater layer; and
   the second heater layer is on the memory element.

5. The device of claim 4, wherein the first and second heater layers comprise a material from the group consisting of TiN, TaN, TiAlN, TaAlN, TiW, TiSiN, or TaSiN.

6. The device of claim 1, wherein the programmable resistive memory material comprises a combination of two or more materials from the group consisting of Ge, Sb, Te, Se, In, Ti, Ga, Bi, Sn, Cu, Pd, Pb, Ag, S, or Au.

7. The device of claim 1, wherein the memory element has a width between about 50 nm and about 80 nm.

8. The device of claim 4, wherein the top electrode has a bottom surface in contact with a top surface of the second heater layer, the bottom surface of the top electrode having a width the same as that of the top surface of the second heater layer.

9. The device of claim 8, wherein the top electrode comprises a portion of a bit line.

10. The device of claim 4, wherein the multi-layer stack has a width less than a width of a top surface of the bottom electrode in contact with the first heater layer.

11. The device of claim 4, wherein the first and second heater layers have sides aligned with sides of the memory element, so that the first and second heater layers and the memory element have substantially the same width.

12. A memory device comprising:
a bottom electrode;
a top electrode;
a multi-layer stack comprising a plurality of layers, the multi-layer stack contacting the top and bottom electrodes to define an inter-electrode current path through each of said layers between the top and bottom electrodes, the multi-layer stack including a first heater layer and a second heater layer and a memory element comprising a programmable resistive memory material, the memory element being sandwiched by the first heater layer and the second heater layer, the multi-layer stack having a sidewall surface defining a width of the first heater layer and of the second heater layer and of the memory element transverse to the inter-electrode current path which is less than a width of a top surface of the bottom electrode in contact with the multi-layer stack; and
an air gap adjacent to the sidewall surface of the memory element, the first heater layer, and the second heater layer and self-aligned to the memory element, wherein the sidewall of the memory element is fully surrounded by the air gap.

13. The device of claim 12, wherein the memory element has a width less than a minimum feature size for a lithographic process used to form the memory device.

14. The device of claim 12, wherein:
the first heater layer is on the bottom electrode, the memory element is on the first heater layer; and
the second heater layer is on the memory element.

15. The device of claim 14, wherein the first and second heater layers comprise a material from the group consisting of TiN, TaN, TiAlN, TaAlN, TiW, TiSiN, or TaSiN.

16. The device of claim 12, wherein the programmable resistive memory material comprises a combination of two or more materials from the group consisting of Ge, Sb, Te, Se, In, Ti, Ga, Bi, Sn, Cu, Pd, Pb, Ag, S, or Au.

17. The device of claim 12, wherein the memory element has a width between about 50 nm and about 80 nm.

18. The device of claim 14, wherein the top electrode has a bottom surface in contact with a top surface of the second heater layer, the bottom surface of the top electrode having a width the same as that of the top surface of the second heater layer.

19. The device of claim 18, wherein the top electrode comprises a portion of a bit line.

20. The device of claim 14, wherein the multi-layer stack has a width less than a width of a top surface of the bottom electrode in contact with the first heater layer.

21. The device of claim 14, wherein the first and second heater layers have sides aligned with sides of the memory element, so that the first and second heater layers and the memory element have substantially the same width.

* * * * *